United States Patent
Tomikawa et al.

(10) Patent No.: US 9,629,234 B2
(45) Date of Patent: *Apr. 18, 2017

(54) WIRING MEMBER FOR SHIELDING NOISE, AND METHOD OF MANUFACTURING, METHOD OF DESIGNING, AND ELECTRONIC APPARATUS THEREOF

(71) Applicant: FUJI XEROX CO., LTD., Tokyo (JP)

(72) Inventors: Ichiro Tomikawa, Ebina (JP); Yasumasa Asaya, Yokohama (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/874,706

(22) Filed: Oct. 5, 2015

(65) Prior Publication Data

US 2016/0134038 A1 May 12, 2016

(30) Foreign Application Priority Data

Nov. 6, 2014 (JP) .................................. 2014-226482

(51) Int. Cl.
*H01R 13/6594* (2011.01)
*H05K 1/02* (2006.01)
(Continued)

(52) U.S. Cl.
CPC ......... *H05K 1/0216* (2013.01); *H01R 12/727* (2013.01); *H01R 12/79* (2013.01);
(Continued)

(58) Field of Classification Search
CPC ............ H01R 12/7076; H01R 13/6594; H01R 43/205
(Continued)

(56) References Cited

U.S. PATENT DOCUMENTS 3,459,879 A * 8/1969 Gerpheide ............... H01B 7/08
174/117 FF
3,582,532 A * 6/1971 Plummer ............. H02G 3/0487
174/102 R
(Continued)

FOREIGN PATENT DOCUMENTS

JP H04-36722 U 3/1992
JP 2002-329425 A 11/2002
(Continued)

*Primary Examiner* — Timothy Thompson
*Assistant Examiner* — Michael F McAllister
(74) *Attorney, Agent, or Firm* — Oliff PLC (57) ABSTRACT

There is provided a wiring member including: a wiring substrate including wirings including a ground line, and a first insulating layer that covers the wirings and has an opening portion exposing at least a portion of the ground line; a first conductive sheet sandwiched between a second insulating layer and a conductive bonding layer disposed on the first insulating layer and electrically connected to the ground line through the opening portion; a second conductive sheet including first and second electrically connectable portions to another member, the first connection portion disposed between a portion of the first conductive sheet and the wiring substrate to be electrically connected to the conductive bonding layer of the first conductive sheet; and a shielding member that is disposed to be electrically connected to the second connection portion of the second conductive sheet.

16 Claims, 7 Drawing Sheets

(51) Int. Cl.
*H01R 12/72* (2011.01)
*H01R 12/79* (2011.01)
*H05K 1/11* (2006.01)

(52) U.S. Cl.
CPC ............ *H05K 1/0219* (2013.01); *H05K 1/118* (2013.01); *H05K 2201/0715* (2013.01)

(58) Field of Classification Search
USPC ............................................ 174/257; 439/65
See application file for complete search history.

(56) References Cited

U.S. PATENT DOCUMENTS

| | | | | | |
|---|---|---|---|---|---|
| 3,612,744 | A | * | 10/1971 | Thomas | H01B 11/20 174/117 FF |
| 3,700,825 | A | * | 10/1972 | Taplin | H01B 7/08 174/113 R |
| 3,757,029 | A | * | 9/1973 | Marshall | H01B 7/08 174/117 F |
| 4,287,385 | A | * | 9/1981 | Dombrowsky | H01B 7/0861 174/105 R |
| 5,008,490 | A | * | 4/1991 | Strauss | H01B 7/0861 174/115 |
| 6,969,807 | B1 | * | 11/2005 | Lin | H01B 7/0861 174/117 F |
| 2011/0036615 | A1 | * | 2/2011 | Noda | H01B 7/0838 174/117 F |
| 2014/0325995 | A1 | * | 11/2014 | Zizzo | H05K 1/0298 60/801 |
| 2016/0134039 | A1 | | 5/2016 | Tomikawa et al. | |

FOREIGN PATENT DOCUMENTS

| | | |
|---|---|---|
| JP | 2004-259619 A | 9/2004 |
| JP | 2013-175375 A | 9/2013 |

\* cited by examiner

WIRING MEMBER FOR SHIELDING NOISE, AND METHOD OF MANUFACTURING, METHOD OF DESIGNING, AND ELECTRONIC APPARATUS THEREOF

CROSS-REFERENCE TO RELATED APPLICATION(S)

This application is based on and claims priority under 35 U.S.C. 119 from Japanese Patent Application No. 2014-226482 filed on Nov. 6, 2014.

BACKGROUND

1. Technical Field

The present invention relates to a wiring member, a method of manufacturing the same, a method of designing the same, and an electronic apparatus.

2. Background Art

Hitherto, there has been known a wiring member in which, when a shielding member is provided on a wiring substrate including plural wirings, including a signal line and a ground line, and an insulating layer that covers the plural wirings, an opening portion exposing at least a portion of the ground line is provided in the insulating layer, and the shielding member is grounded to the ground line through the opening portion (for example, see JP-A-2004-259619, JP-A-2002-329425 and JP-UM-A-04-36722.

SUMMARY

According to an aspect of the invention, there is provided a wiring member including: a wiring substrate that includes a plurality of wirings including a ground line, and a first insulating layer that covers the plurality of wirings and has an opening portion exposing at least a portion of the ground line; a first conductive sheet in which a second insulating layer is provided on one surface side of the first conductive sheet and a conductive bonding layer is provided on the other surface side of the first conductive sheet, in which the conductive bonding layer is disposed, toward the wiring substrate, on the first insulating layer, and in which the conductive bonding layer is electrically connected to the ground line through the opening portion; a second conductive sheet that includes first and second connection portions capable of being electrically connected to another member, the first connection portion being disposed between a portion of the first conductive sheet and the wiring substrate so as to be electrically connected to the conductive bonding layer of the first conductive sheet; and a shielding member that is disposed on the wiring substrate, the first conductive sheet, and the second conductive sheet and is electrically connected to the second connection portion of the second conductive sheet.

BRIEF DESCRIPTION OF THE DRAWINGS

Exemplary embodiments of the present invention will de described in detail based on the following figures, wherein.

DETAILED DESCRIPTION

Hereinafter, an embodiment of the present invention will be described with reference to the accompanying drawings. Meanwhile, in each drawing, components having substantially the same function are denoted by the same reference numerals and signs, and a repeated description will be omitted. Meanwhile, the scales and shapes of the drawing include portions emphasized in order to facilitate the understanding of features of the present invention, and are not necessarily the same as the scales and shapes of actual members.

Embodiment

Figure 1:
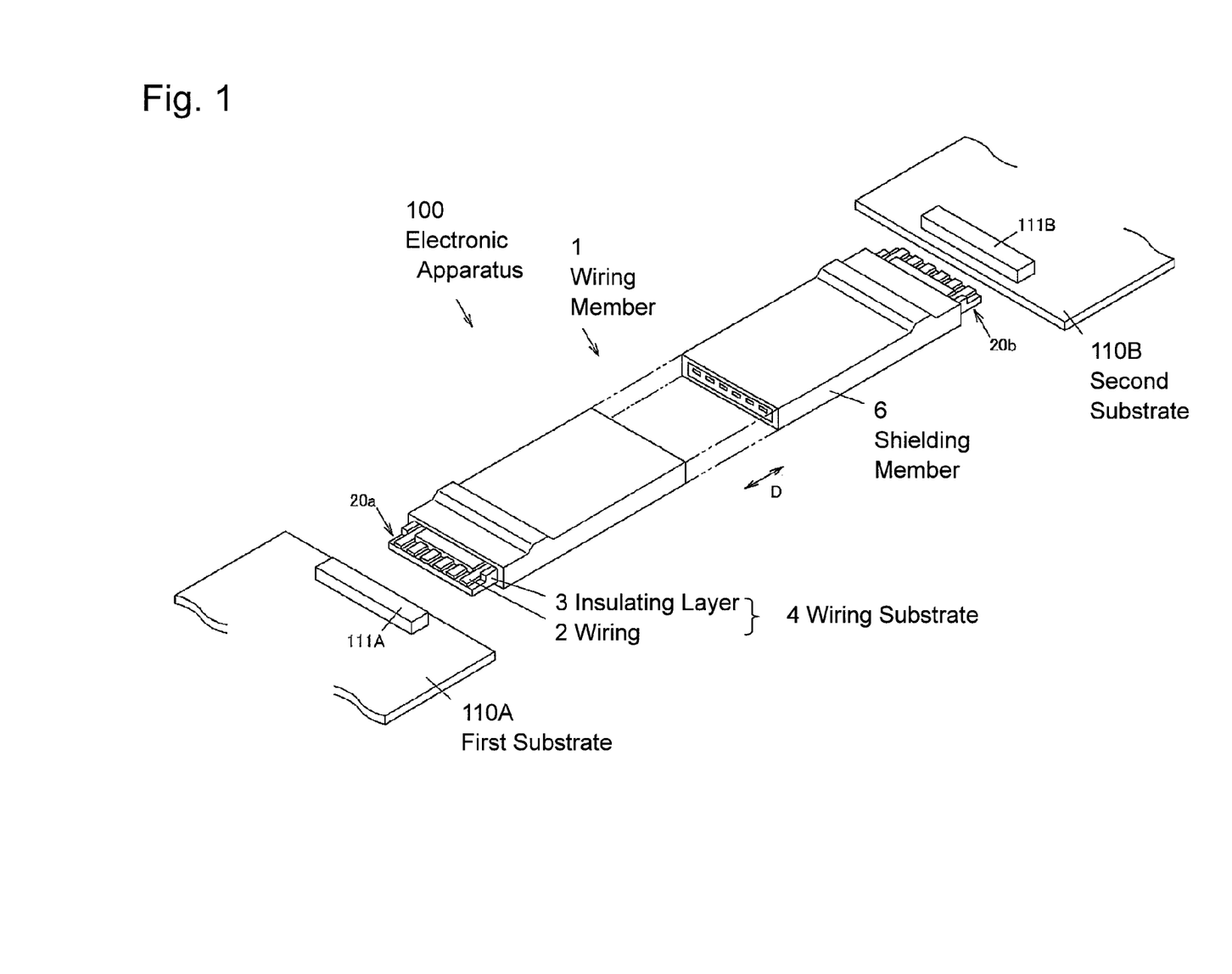
FIG. 1 is a perspective view showing a schematic configuration example of a wiring member according to an embodiment of the present invention and a schematic configuration example of an electronic apparatus to which the wiring member is applied.

FIG. 1 is a perspective view showing a schematic configuration example of a wiring member according to an embodiment of the present invention and a schematic configuration example of an electronic apparatus to which the wiring member is applied.

An electronic apparatus 100 includes a first substrate 110A including a first connector 111A, a second substrate 110B including a second connector 111B, and a wiring member 1 according to the present embodiment which electrically connects the first connector 111A and the second connector 111B. The number of wiring members 1 is not limited to one, and may be two or more.

Examples of the electronic apparatus 100 include a television receiver, an on-vehicle equipment such as a car navigation device or an audio device, an image forming apparatus such as a printer or a multifunction machine, and the like, but are not limited thereto.

For example, an electronic component or a power supply is mounted on the first and second substrates 110A and 110B. The wiring member 1 transmits a signal having a frequency of, for example, 10 MHz to 1 GHz or power. When the electronic apparatus 100 is an image forming apparatus, for example, an image writing signal which is modulated on the basis of image data of cyan (C), magenta (M), yellow (Y), and black (K) colors through four wiring members 1 corresponding to CMYK is transmitted from a controller to an exposure apparatus.

The wiring member 1 includes a wiring substrate 4 in which plural wirings are covered with an insulating layer, a shielding member 6 that covers the wiring substrate 4, and first and second conductive sheets, to be described later, which electrically connects ground lines among the plural wirings of the wiring substrate 4 and the shielding member 6. In addition, the wiring member 1 is provided with terminal portions 20a and 20b, from which plural wirings 2 are exposed, at both ends thereof in a longitudinal direction D. The terminal portions 20a and 20b at both ends are electrically connected to the first connector 111A provided on the first substrate 110A and the second connector 111B provided on the second substrate 110B, respectively.

The phrase "wiring member" as used herein refers to a member, having flexibility, which has an elongated flat plate shape, includes plural wirings covered with an insulating layer, and has both ends in the longitudinal direction D from which wirings are exposed as terminal portions. The term "ends" as used herein refers to portions of the wiring member 1 in which the terminal portions 20a and 20b are present. The wiring member includes a flexible flat cable (FFC), a flexible printed circuit board (FPC) in which an element is mounted on a substrate, and the like. The phrase "first conductive sheet" as used herein refers to a sheet-shaped member having a thickness which is smaller than the width and length thereof and having conductivity. The first conductive sheet includes a sheet in which a metal layer is formed on one surface of an insulating layer and a conductive bonding layer is formed on the metal layer, a sheet that does not include an insulating layer or a conductive bonding layer, and a sheet which is constituted by only a metal layer. The phrase "second conductive sheet" as used herein refers to a sheet-shaped member having a thickness which is smaller than the width and length thereof and having conductivity. The second conductive sheet includes a sheet which is constituted by only a metal layer, and a sheet in which a bonding layer is formed on a metal layer. The phrase "shielding member" as used herein refers to a member that has a function of shielding noise radiated from a wiring to the outside and noise entering a wiring from the outside. The shielding member includes a member in which a metal layer is formed on one surface of an insulating layer and a bonding layer is formed on the metal layer, a member that does not include an insulating layer or a bonding layer, and a member which is constituted by only a metal layer.

Figure 2:
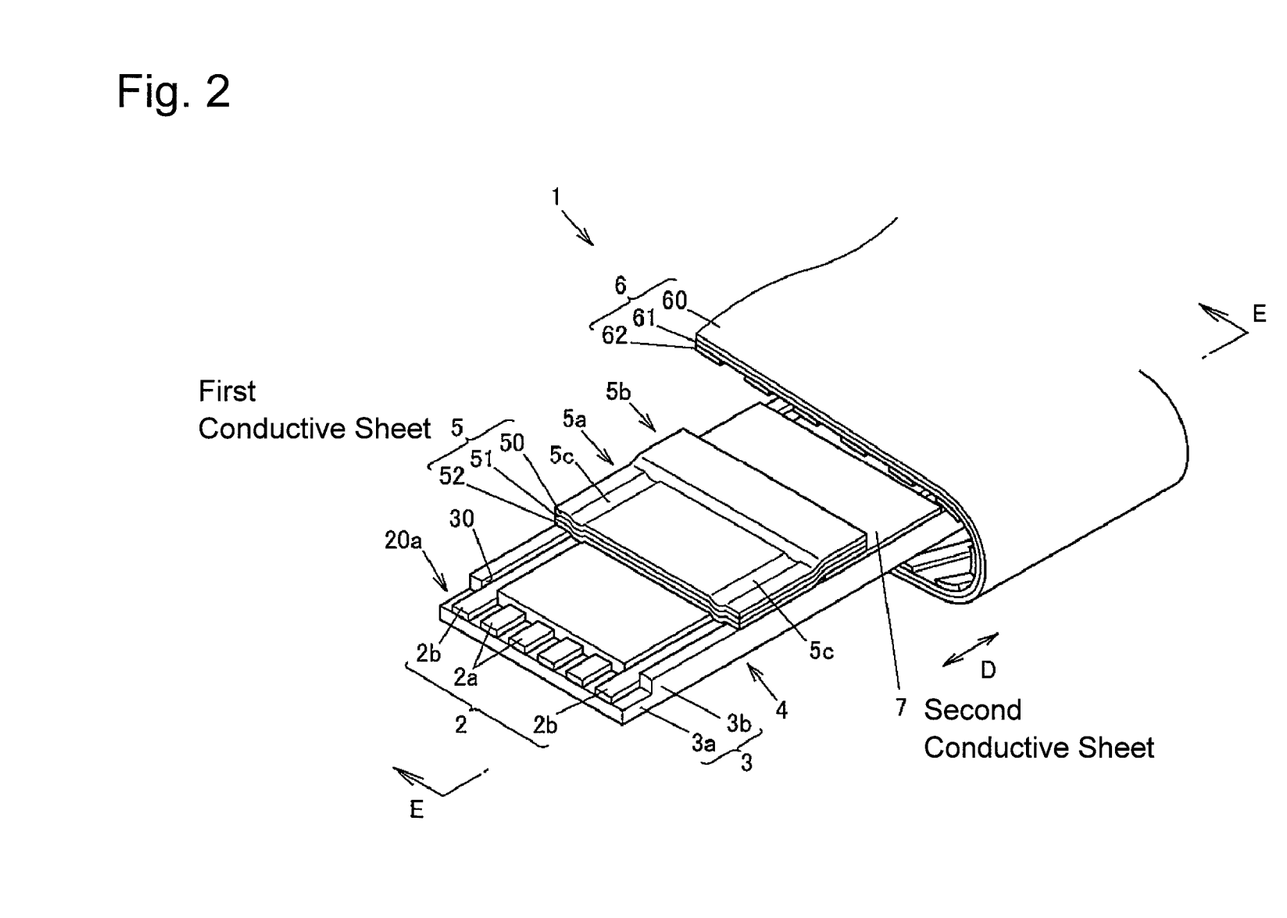
FIG. 2 is an exploded perspective view of the vicinity of one end of the wiring member.
Figure 3:
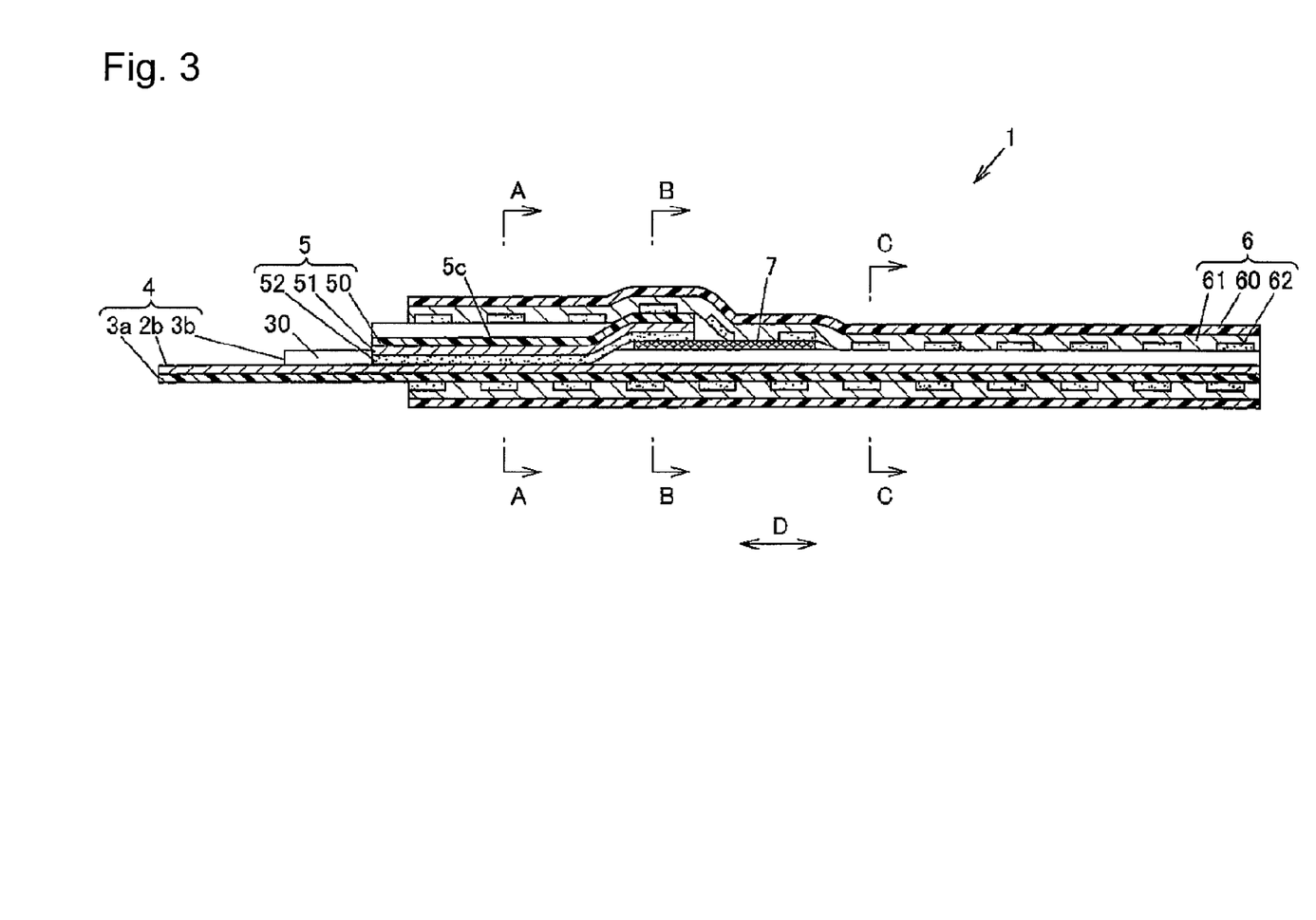
FIG. 3 is a cross-sectional view taken along line E-E shown in FIG. 2.
Figure 4A:
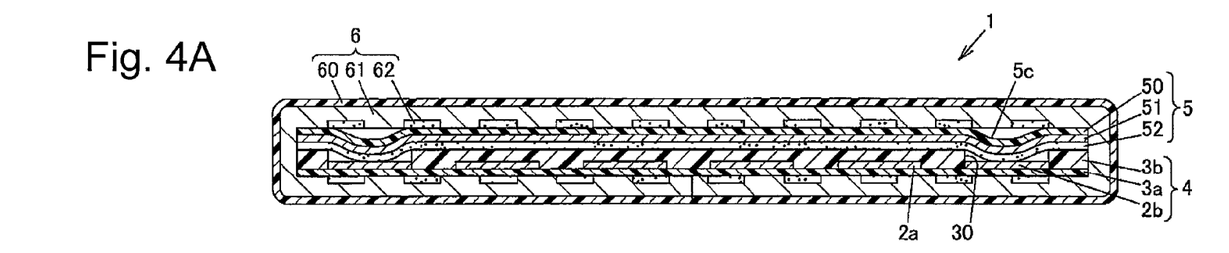
FIGS. 4A to 4C are a cross-sectional view taken along line A-A, a cross-sectional view taken along line B-B, and a cross-sectional view taken along line C-C shown in FIG. 3, respectively.
Figure 4B:
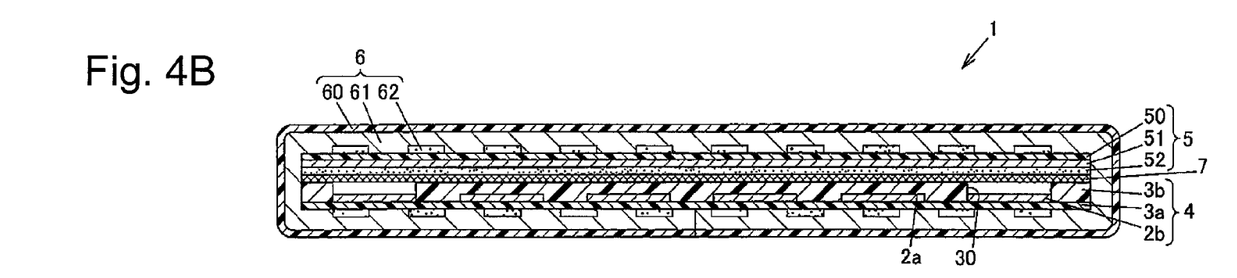
Figure 4C:
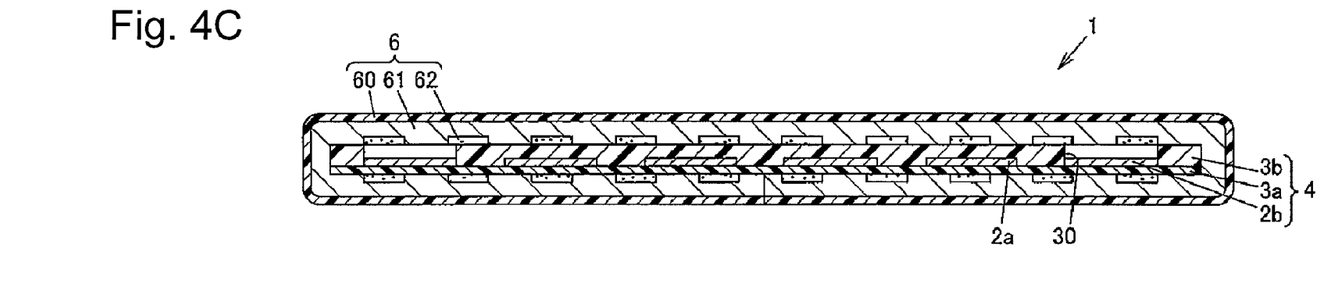

FIG. 2 is an exploded perspective view of the vicinity of one end of the wiring member 1. FIG. 3 is a cross-sectional view taken along line E-E shown in FIG. 2. FIGS. 4A to 4C are a cross-sectional view taken along line A-A, a cross-sectional view taken along line B-B, and a cross-sectional view taken along line C-C shown in FIG. 3, respectively.

As shown in FIG. 2, in the wiring member 1, a first conductive sheet 5 is disposed in a region in the vicinity of the end (for example, a region having an interval of equal to or less than a quarter of the total length in the longitudinal direction D with respect to the end). Meanwhile, the region in which the first conductive sheet 5 is disposed may be a region other than the region in the vicinity of the end.

Configuration of Wiring Substrate

The wiring substrate 4 includes the plural wirings 2 including ground lines 2b, and an insulating layer 3 that has an opening portion formed therein, covers the plural wirings 2, and exposes at least portions of the ground lines 2b. Specifically, the wiring substrate 4 includes the plural wirings 2 which are arrayed in parallel at fixed intervals, and the insulating layer 3 that covers the plural wirings 2.

The wirings 2 include signal lines 2a and the ground lines 2b. The number of ground lines 2b is two in the drawing, but may be one or three or more. The number of wirings 2 is six in the drawing, but is not limited to six. The wiring 2 is constituted by, for example, a flat plate-shaped conductor having a rectangular cross section, but may have another shape having a rounded rectangular shape or the like. The flat plate-shaped conductor is preferable in achieving electrical connection to the first conductive sheet 5. For example, a wiring obtained by applying gold plating to copper can be used as the wiring 2.

The wiring substrate 4 is formed by disposing the plural wirings 2 on one surface of an insulating layer 3a with a bonding layer and performing pressing using a heating roll so that the plural wirings 2 are interposed between a pair of insulating layers 3a and 3b with a bonding layer. The insulating layers 3a and 3b can be formed of, for example, polyester terephthalate (PET). In the insulating layer 3b on the upper side, a groove 30 exposing the ground line 2b is formed along the longitudinal direction D as shown in FIG. 2.

The groove 30 is an example of an opening portion, and may be an elongated hole, a circular hole, or the like. The number of opening portions may be one for one ground line 2b. Alternatively, one opening portion may be formed in the region in the vicinity of the end, or plural opening portions may be formed in the region in the vicinity of the end along the longitudinal direction D. The opening portion may be positioned in a region other than the region in the vicinity of the end.

Configuration of First Conductive Sheet

In the first conductive sheet 5, an insulating layer 50 is provided on one surface side thereof, a conductive bonding layer 52 is provided on the other surface side, the conductive bonding layer 52 is disposed toward the wiring substrate 4 on the insulating layer 3 in which the grooves 30 of the wiring substrate 4 are formed, and the conductive bonding layer 52 is electrically connected to the ground lines 2b through the grooves 30.

Specifically, the first conductive sheet 5 includes the insulating layer 50, a metal layer 51 which is provided on the insulating layer 50, and the conductive bonding layer 52 which is provided on the metal layer 51.

As shown in FIG. 2, the first conductive sheet 5 includes a first connection portion 5a which is electrically connected to the ground lines 2b and a second connection portion 5b which is electrically connected to the shielding member 6, and is disposed on the surface of the insulating layer 3b with a bonding layer of the wiring substrate 4 including the grooves 30. In addition, connector portions 5c at two locations facing the ground lines 2b of the first connection portion 5a and the vicinity of the first connector portions are pressed by a thermal-compression press machine as shown in FIG. 2, and thus the conductive bonding layer 52 is pushed into the grooves 30 as shown in FIG. 4A, and the conductive bonding layer 52 is thermally compressed on and electrically connected to the ground lines 2b.

Meanwhile, a method of electrically connecting the first conductive sheet 5 to the ground lines 2b is not limited to thermal compression, and a method using a heating roller or another method such as ultrasonic bonding may be used. The ultrasonic bonding is a method which is effectively used when the first conductive sheet 5 is constituted by only a metal layer or is constituted by a metal layer and a conductive bonding layer. In addition, a protrusion entering the groove 30 may be provided on a press surface of an upper plate of the thermal-compression press machine. Accordingly, the conductive bonding layer 52 of the first conductive sheet 5 is easily pushed into the groove 30, and thus electrical connection to the ground line 2b becomes more reliable.

Compared to a configuration in which the shielding member 6 is directly connected to the wiring substrate 4 without using the first conductive sheet 5, it is preferable to use the first conductive sheet 5 having characteristics in which electric resistance between the shielding member 6 and the ground line 2b is suppressed even when the conductive sheet is bonded under the same conditions. In addition, compared to a configuration in which the shielding member 6 is connected to the wiring substrate 4 through only the second conductive sheet 7 without using the first conductive sheet 5, it is preferable to use the first conductive sheet 5 having characteristics in which electric resistance between the shielding member 6 and the ground line 2b is suppressed. Specifically, the first conductive sheet 5 having a smaller contact resistance with the ground line 2b than the shielding member 6 or the second conductive sheet 7, that is, the first conductive sheet 5 having a larger contact area or having a higher contact degree, at the time of performing thermal compression on the ground line 2b under the same conditions, is used. For example, it is preferable that the first conductive sheet 5 has a thickness smaller than that of the shielding member 6. In addition, it is preferable that the metal layer 51 of the conductive sheet 5 has stretching property higher than that of the metal layer 61 of the shielding member 6 and has a thickness smaller than that of the metal layer 61 of the shielding member 6. Further, it is preferable that first conductive sheet 5 has a thickness smaller than that of the second conductive sheet. In addition, it is preferable that the metal layer 51 of the first conductive sheet 5 has stretching property higher than those of conductive cloths 70 and 74 and a metal foil 72, to be described later in FIGS. 6A to 6G, in the second conductive sheet 7 and has a thickness smaller than those of the conductive cloths 70 and 74 and the metal foil 72.

Specifically, the first conductive sheet 5 to be used in the present embodiment has a total thickness of approximately 30 μm which is smaller than that of the shielding member 6. For example, PET having a thickness of approximately 10 μm can be used as the insulating layer 50 of the first conductive sheet 5. The metal layer 51 is formed of for example, silver which has stretching property higher than that of the metal layer 61 of the shielding member 6. In addition, the metal layer 51 to be used may have a thickness of, for example, approximately 0.1 μm which is smaller than that of the metal layer 61 of the shielding member 6, and may have a surface resistance of approximately 200 mΩ/sq. The conductive bonding layer 52 to be used may be formed by mixing, for example, silver-coated copper powder in a polyester-based thermoplastic resin and may have a thickness of approximately 20 μm. The conductive bonding layer 52 to be used may have a bonding strength of, for example, approximately 4 N/cm (versus PET).

Although the number of first conductive sheets 5 and the position thereof in the longitudinal direction D are not particularly limited, it is preferable that the conductive sheet is provided at an end of the ground line 2b in the longitudinal direction D in the wiring substrate 4, and more preferably, at both ends thereof. The shielding member 6 can be grounded at a position close to a ground of the electronic apparatus 100 compared to a case where the conductive sheet is provided in a region other than the region in the vicinity of the end of the wiring substrate 4, for example, in a center portion, and thus a higher shielding effect can be expected.

Configuration of Second Conductive Sheet

The second conductive sheet 7 includes first and second connection portions capable of electrically connected to another member, and is disposed so that the first connection portion is disposed between the second connection portion 5b of the first conductive sheet 5 and the insulating layer 3 of the wiring substrate 4 and the second connection portion is exposed from the first conductive sheet 5. Since the insulating layer 50 is provided on one surface side of the first conductive sheet 5, electrical connection between the first conductive sheet 5 and the shielding member 6 is not performed even when the shielding member 6 is provided on the first conductive sheet 5 in a state where the second conductive sheet 7 is not present, and thus the electrical connection therebetween is performed through the second conductive sheet 7. In this manner, the second conductive sheet 7 has a role in performing electrical connection between the first conductive sheet 5 and the shielding member 6, and is constituted by a sheet-like member such as a conductive cloth.

Configuration of Shielding Member

The shielding member 6 includes an insulating layer 60, the metal layer 61 which is provided on one surface of the insulating layer 60, and an insulating bonding layer 62 which is partially provided on the surface of the metal layer 61. The insulating layer 60 to be used may be formed of, for example, PET having a thickness of approximately 10 μm to 20 μm. The metal layer 61 to be used may be formed of, for example, aluminum having a thickness of approximately 10 μm to 20 μm. The insulating bonding layer 62 to be used may be formed of, for example, a thermosetting adhesive having a thickness of approximately 10 μm to 20 μm.

The shielding member 6 is provided so as to cover the vicinity of the wiring substrate 4 and the first conductive sheet 5 except for the terminal portions, and is bonded to a portion of the second conductive sheet 7 which is exposed. Accordingly, an electrical connection path is formed which continues from the shielding member 6 to the second conductive sheet 7, the first conductive sheet 5, and the ground lines 2b in this order.

Figure 5:
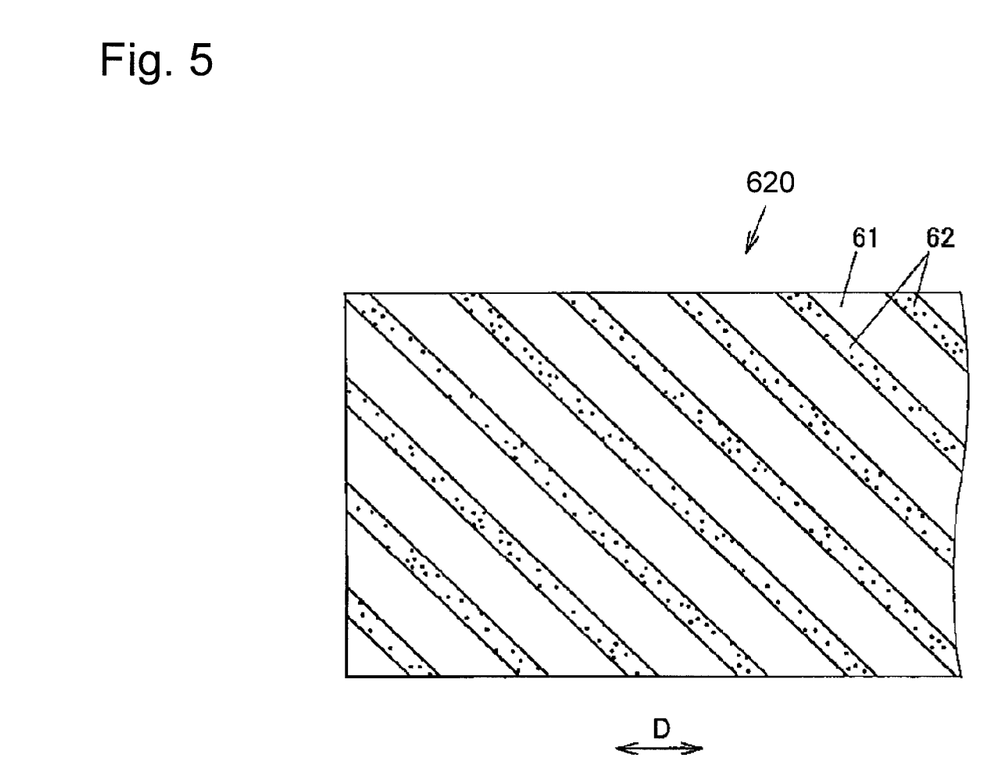
FIG. 5 is a plan view showing a main portion of a shielding member.

FIG. 5 is a plan view showing a main portion of the shielding member 6. The insulating bonding layer 62 of the shielding member 6 is constituted by plural line patterns 620 which extend in a direction intersecting the longitudinal direction D so as to be parallel to each other. That is, the insulating bonding layer 62 is constituted by repetitive patterns in which the line patterns 620 are repeated in a width direction perpendicular to the longitudinal direction D. The patterns may be patterns other than the patterns shown in FIG. 5 because electrical conduction may be preferably allowed at the time of bonding the shielding member 6 to the exposed portion of the second conductive sheet 7. For example, the patterns may be plural line patterns which extend in the longitudinal direction D so as to be parallel to each other, dot patterns constituted by dots which having a size that does not cover the entire second connection portion 5b, or other repetitive patterns. Further, the patterns may not be repetitive patterns insofar as electrical conduction is allowed.

The plural line patterns 620 extending in a direction intersecting the longitudinal direction D are used as the insulating bonding layer 62, and thus a region of the metal layer 61 which is not provided with the line patterns 620 comes into contact with the portion of the second conductive sheet 7 which is exposed, thereby allowing the metal layer 61 of the shielding member 6 to be electrically connected to the ground lines 2b through the second conductive sheet 7 and the first conductive sheet 5. In addition, the accurate positioning of the second conductive sheet 7 at the time of bonding the shielding member 6 becomes unnecessary. In addition, shielding characteristics are stabilized by bringing the shielding member 6 into close contact with the wiring substrate 4 by the insulating bonding layer 62.

Figure 6A:
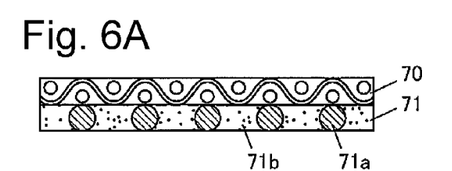
FIG. 6A is a cross-sectional view of a second conductive sheet.

FIG. 6A is a cross-sectional view of the second conductive sheet 7 according to the present embodiment. The second conductive sheet 7 includes a conductive cloth 70 and an adhesive layer 71 provided on one surface of the conductive cloth 70.

The conductive cloth 70 is formed by weaving conductive yarns that are obtained by plating the surfaces of non-conductive yarns formed of a resin such as polyester with a metal such as nickel. The conductive cloth 70 has a thickness of, for example, approximately 120 µm. The surface resistance of the conductive cloth 70 is, for example, equal to or less than 0.05 Ω/sq. A contact resistance value of the conductive cloth 70 is, for example, equal to or less than 0.01Ω. Meanwhile, the conductive cloth is not limited to a cloth based on a non-conductive yarn-like member like the conductive cloth 70, and a conductive cloth using a yarn-like member which is entirely formed of a conductive metal or the like may be used.

The adhesive layer 71 includes metal particles 71a and an adhesive 71b. The adhesive layer 71 has a thickness of, for example, approximately 50 µm.

Modified Example of Second Conductive Sheet

FIGS. 6B to 6G are cross-sectional views showing a modified example of the second conductive sheet 7. The second conductive sheet 7 may be a sheet-like member having a function of performing electrical connection between the shielding member 6 and the first conductive sheet 5 having the insulating layer 50 provided on one surface side thereof, and may be, for example, sheets shown in FIGS. 6B to 6G.

Figure 6B:
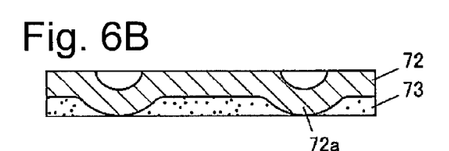
FIGS. 6B to 6G are cross-sectional views showing modified examples of the second conductive sheet.

A second conductive sheet 7 shown in FIG. 6B includes a metal foil 72 having plural embossments 72a provided therein, and an adhesive layer 73 which is provided on a surface on the side where the embossments 72a of the metal foil 72 protrude.

Figure 6C:
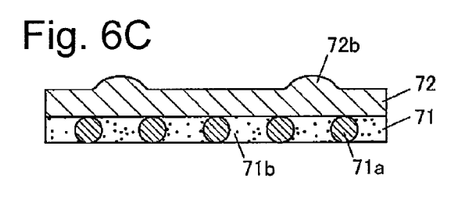

A second conductive sheet 7 shown in FIG. 6C includes a metal foil 72 having plural embossments 72b provided therein, and an adhesive layer 71 which is provided on a surface on the opposite side to the side where the embossments 72b of the metal foil 72 protrude. The adhesive layer 71 includes metal particles 71a and an adhesive 71b.

Figure 6D:
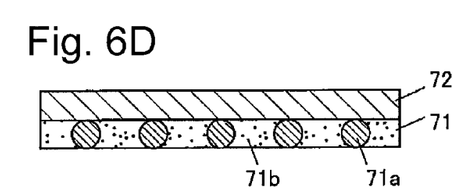

A second conductive sheet 7 shown in FIG. 6D includes a metal foil 72 and an adhesive layer 71 which is provided on one surface of the metal foil 72. The adhesive layer 71 includes metal particles 71a and an adhesive 71b.

Figure 6E:
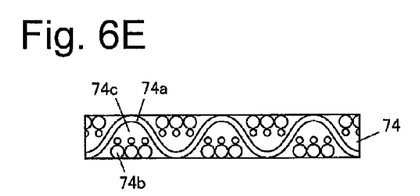

A second conductive sheet 7 shown in FIG. 6E is constituted by a conductive cloth 74. The conductive cloth 74 includes conductive yarns 74a that are obtained by plating the surfaces of non-conductive yarns formed of a resin such as polyester with a metal such as nickel, metal particles 74b, and an adhesive 74c.

Figure 6F:
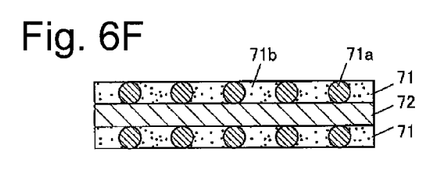

A second conductive sheet 7 shown in FIG. 6F includes a metal foil 72 such as an aluminum foil, and adhesive layers 71 provided on both surfaces of the metal foil 72. The adhesive layer 71 includes metal particles 71a and an adhesive 71b.

Figure 6G:
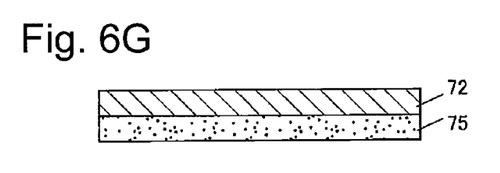

A second conductive sheet 7 shown in FIG. 6G includes a metal foil 72 such as a copper foil, and an adhesive layer 75, constituted by a non-conductive adhesive, which is provided on one surface of the metal foil 72. Meanwhile, the metal foils 72 and the conductive cloths 70 and 74 in FIGS. 6A to 6G are examples of metal layers. For example, a layer formed by metal vapor deposition may be used instead of the metal foil 72.

(Method of Designing Wiring Member)

Next, an example of a method of designing a wiring member will be described.

(1) Measurement of Noise Characteristics

First, noise characteristics in a case where the size of the first conductive sheet 5 is changed are measured. The size of the first conductive sheet 5 is, for example, the length of a diagonal line. The noise characteristics may be noise characteristics in a single wiring member 1, or may be noise characteristics in a state where the wiring member is embedded in an electronic apparatus. Meanwhile, the size of the first conductive sheet 5 may be a length in the longitudinal direction D or an area.

(2) Selection of Size of First Conductive Sheet

Next, the size of the first conductive sheet 5 which satisfies a noise standard value required for an electronic apparatus having the wiring member mounted thereon is selected from measurement results.

(Method of Manufacturing Wiring Member)

Next, an example of a method of manufacturing the wiring member 1 will be described.

(1) Formation of Wiring Substrate

First, a cutout window is opened in a region corresponding to the end of the insulating layer 3b with a bonding layer by punching or the like, and the insulating layer 3a with a bonding layer having the plural wirings 2 formed thereon and the insulating layer 3b with a bonding layer covering the plural wirings 2 are bonded to each other by a heating roller.

Next, a portion of the insulating layer 3b which covers the ground line 2b is peeled along the longitudinal direction D. In this manner, the wiring substrate 4 is formed.

(2) Arrangement of First and Second Conductive Sheets

Next, the first conductive sheet 5 having a size selected in the method of designing a wiring member is prepared.

Next, the second conductive sheet 7 is disposed in a region in the vicinity of each of the terminal portions 20a and 20b. Next, the prepared first conductive sheet 5 is disposed in a region in the vicinity of each of the terminal portions 20a and 20b. Next, the first conductive sheet 5 is bonded to the surface of the insulating layer 3b by performing thermal compression on a region including a connector portion 5c under conditions of a temperature of 120° C., a pressure of 0.5 MPa to 1 MPa, and a time of 5 seconds to 10 seconds, and the conductive bonding layer 52 is brought into contact with the ground line 2b so as to be electrically connected thereto. The thermal compression may be performed on a region including at least the connector portion 5c, and may be performed over a wide range including the entirety of the first conductive sheet 5 and the second conductive sheet 7.

(3) Covering with Shielding Member

The entirety except for the terminal portions 20a and 20b of the wiring substrate 4 having the first conductive sheet 5 and the second conductive sheet 7 disposed thereon is covered with the shielding member 6, and the shielding member 6 is bonded to the first conductive sheet 5, the second conductive sheet 7, and the wiring substrate 4 by a heating roller. In this manner, the wiring member 1 is formed.

When the plural wiring members 1 are manufactured, the sizes of the first conductive sheets 5 are different from each other in accordance with the noise characteristics required for an electronic apparatus on which the wiring members are mounted.

(Operations and Effects of the Present Embodiment)

(1) Reduction in Connection Impedance Between First Conductive Sheet and Ground Line In addition, when a sheet-like member is thermally compressed on a wiring member such as an FFC, a heating roller is generally used (for example, see paragraph [0038] of JP-A-2002-329425 and FIG. 5D of JP-UM-A-04-36722). For this reason, also in a structure of the present embodiment in which a first conductive sheet is interposed between a wiring substrate and a shielding member, a method of performing thermal compression using a heating roller in a state where the first conductive sheet is disposed on the wiring substrate or in a state where the shielding member is disposed on the first conductive sheet is considered.

However, in the case of the heating roller, since pressure is applied while relatively moving the wiring member and the heating roller, the first conductive sheet is not likely to sufficiently follow the concavo-convex shape of the opening portion due to a cause such as a change in pressure applied to the first conductive sheet in association with the relative movement, and it is difficult to obtain a desired bonding state (connection impedance), and thus a higher shielding effect is not obtained.

Figure 7:
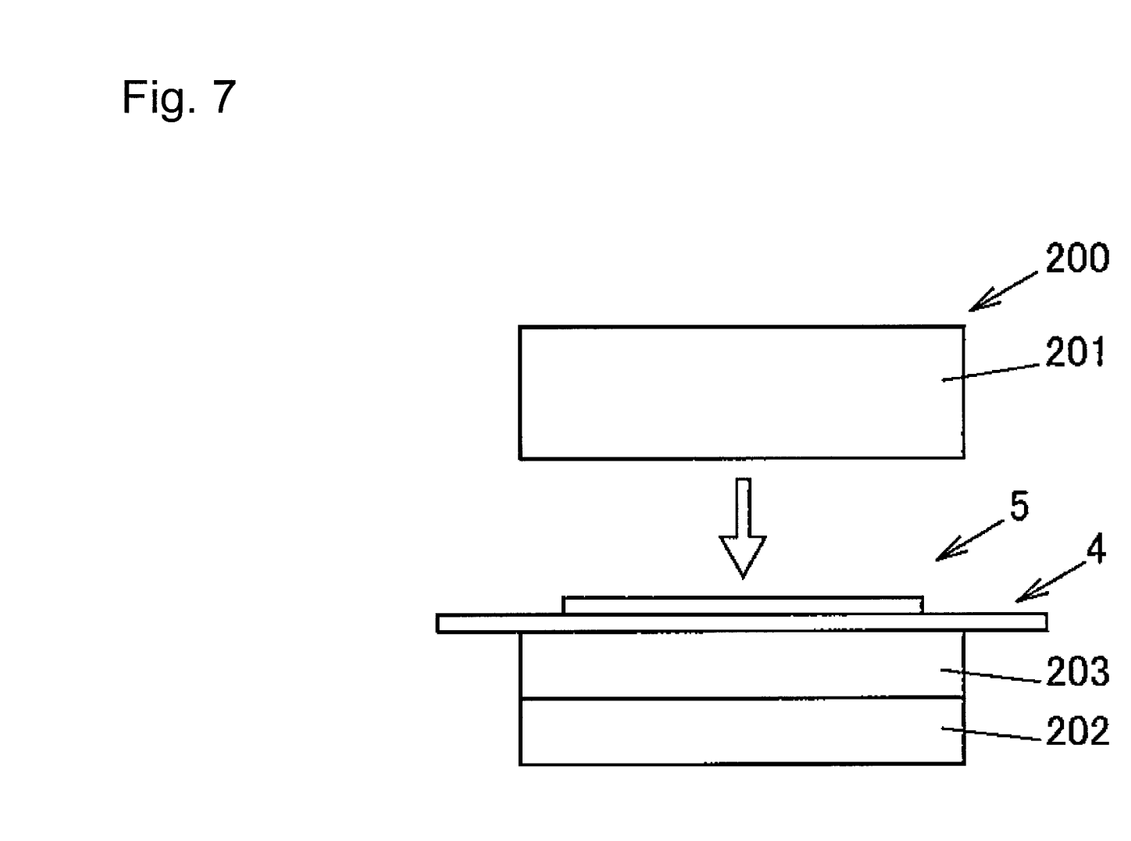
FIG. 7 is a diagram showing a process of thermally compressing a first conductive sheet on a wiring substrate using a thermal-compression press machine.

Consequently, in the present embodiment, when the first conductive sheet is thermally bonded, connection impedance between the first conductive sheet 5 and the ground line is easily reduced by, for example, using a thermal compression press machine 200 capable of applying pressure in a stopped state as shown in FIG. 7, or the like, compared to a case where the thermal compression of a first conductive sheet is performed using a heating roller. The thermal compression press machine 200 includes an upper plate 201, a lower plate 202, and an elastic member 203 which is disposed on the lower plate 202. It is preferable that the elastic member 203 is constituted by, for example, sponge having a hardness of approximately 30.

(2) Suppression of Deterioration in Noise Characteristics

In a wiring member mounted on an electronic apparatus, noise having frequencies corresponding to harmonic components of a signal waveform to be transferred tends to be generated. Consequently, a shielding structure that is expected to be capable of exhibiting a noise reduction effect in such specific frequencies is desired. As such a structure, a structure is adopted in which a shielding member and a conductive tape are wound around a wiring substrate, and a conductive holding member holding the wiring substrate is provided at the position of the conductive tape, and the holding member is fixed to a sheet metal box, for example, as in a configuration disclosed in JP-A-2013-175375, and a method of setting the length of the shielding member to be a length corresponding to a specific frequency desired to be suppressed is considered.

However, when the length of the shielding member itself is set to be a length corresponding to a specific frequency desired to be suppressed, an optimized noise suppression effect can be expected with respect to a specific frequency component. However, as a result of a change in the length of the shielding member itself, there is a concern that noise characteristics deteriorate at frequencies other than the specific frequency.

Consequently, in the present embodiment, it is possible not only to expect a noise reduction effect at a specific frequency by changing the size of the first conductive sheet 5 rather than the size of the shielding member 6, but also to suppress a deterioration in noise characteristics at frequencies other than the specific frequency compared to a case where the length of the shielding member 6 itself is changed.

In addition, regarding the wiring member 1 that is expected to be mounted on an electronic apparatus, when the plural wiring members 1 having different sizes of the first conductive sheets 5 are provided from others, the designing of the wiring member becomes easier than in a case where the plural wiring members having different sizes of the first conductive sheets 5 are prepared by oneself.

(Modified Example of Shielding Member)

Regarding the shielding member 6, the shielding member 6 that does not include a bonding layer may be used insofar as the shielding member can be disposed in proximity to the wiring substrate 4 without using an adhesive by covering the vicinity of the wiring substrate 4, or the like. In addition, the shielding member 6 may be provided only on a side where the first conductive sheet 5 is provided. In addition, it is preferable that the shielding member 6 covers the entire wiring substrate 4 except for the vicinity of the terminal portions 20a and 20b of the wiring substrate 4, but a configuration in which the shielding member covers the vicinity of only a portion of the wiring substrate 4 may also be adopted. For example, the shielding member may be provided only in a region in the vicinity of an end, or may be provided in a region other than the region in the vicinity of the end. In addition, a conductive bonding layer may be entirely or partially formed on the surface of the metal layer 61 as a bonding layer.

(Modified Example of First Conductive Sheet)

The first conductive sheet 5 may be entirely or partially covered with the shielding member 6. Further, the first conductive sheet 5 may be configured so as not be entirely covered with the shielding member 6. However, when at least a portion of the first conductive sheet is covered with the shielding member 6, the overlapping portion thereof has a double shielding function, and thus noise can be suppressed compared to a case where the entire first conductive sheet is covered, which leads to a preferable result from the viewpoint of suppressing noise.

Meanwhile, an embodiment of the present invention is not limited to the above-described embodiment, and can be modified and implemented in various ways without departing from the scope of the present invention.

In addition, some of components in the embodiment may be omitted without departing from the scope of the present invention. In the flow of the embodiment, steps may be added, deleted, changed, or switched.

The foregoing description of the exemplary embodiments of the present invention has been provided for the purpose of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and there equivalents.

What is claimed is:

1. A wiring member comprising:
a wiring substrate that includes a plurality of wirings including a ground line, and a first insulating layer that covers the plurality of wirings and has an opening portion exposing at least a portion of the ground line;
a first conductive sheet in which a second insulating layer is provided on one surface side of the first conductive sheet and a conductive bonding layer is provided on the other surface side of the first conductive sheet, in which the conductive bonding layer is disposed, toward the wiring substrate, on the first insulating layer, and in which the conductive bonding layer is electrically connected to the ground line through the opening portion;

a second conductive sheet that includes first and second connection portions capable of being electrically connected to another member, the first connection portion being disposed between a portion of the first conductive sheet and the wiring substrate so as to be electrically connected to the conductive bonding layer of the first conductive sheet; and a shielding member that is disposed on the wiring substrate, the first conductive sheet, and the second conductive sheet and is electrically connected to the second connection portion of the second conductive sheet.

2. The wiring member according to claim 1,
wherein the shielding member includes a metal layer and an insulating bonding layer provided on one surface of the metal layer, and
at least a portion of the shielding member which is bonded to the second conductive sheet does not include the insulating bonding layer.

3. The wiring member according to claim 2,
wherein the insulating bonding layer of the shielding member is constituted by a plurality of line patterns that extend in a longitudinal direction of the wiring substrate or a direction intersecting the longitudinal direction, and
the plurality of line patterns are parallel to each other.

4. The wiring member according to claim 1,
wherein the first conductive sheet has a smaller thickness than the shielding member.

5. The wiring member according to claim 1,
wherein the first conductive sheet has a smaller thickness than the second conductive sheet.

6. The wiring member according to claim 1,
wherein each of the first conductive sheet and the shielding member includes a metal layer, and
the metal layer of the first conductive sheet has a higher stretching property than the metal layer of the shielding member.

7. The wiring member according to claim 1,
wherein each of the first conductive sheet and the second conductive sheet includes a metal layer, and
the metal layer of the first conductive sheet has a stretching property higher than the metal layer of the second conductive sheet.

8. The wiring member according to claim 1,
wherein the first conductive sheet includes a metal layer between the second insulating layer and the conductive bonding layer,
the shielding member includes a metal layer and a bonding layer provided on the metal layer, and
the metal layer of the first conductive sheet has a smaller thickness than the metal layer of the shielding member.

9. The wiring member according to claim 1,
wherein each of the first conductive sheet and the second conductive sheet includes a metal layer and a bonding layer provided on the metal layer, and
wherein the metal layer of the first conductive sheet has a smaller thickness than the metal layer of the second conductive sheet.

10. The wiring member according to claim 1,
wherein a contact resistance between the first conductive sheet and the ground line is smaller than a contact resistance in a case where it is assumed that the shielding member or the second conductive sheet is connected to the ground line through the opening portion under the same conditions as manufacturing conditions in which the first conductive sheet is connected to the ground line.

11. An electronic apparatus comprising:
the wiring member according to claim 1; and
first and second substrates that are connected to each other by the wiring member.

12. A method of manufacturing a plurality of the wiring members according to claim 1, the method comprising:
manufacturing the plurality of wiring members so that lengths of the wiring substrates of the first conductive sheets in a longitudinal direction are different from each other among the plurality of wiring members.

13. The method according to claim 12,
wherein the first conductive sheets are formed so that width directions of the first conductive sheet perpendicular to a longitudinal direction of the wiring substrate are equal to each other among the plurality of wiring members.

14. The method according to claim 12,
wherein the wiring substrates are formed so that width directions of the wiring substrates perpendicular to a longitudinal direction of the wiring substrate are equal to each other among the plurality of wiring members.

15. A method of designing the wiring member according to claim 1, the method comprising:
measuring noise characteristics in a case where a size of the first conductive sheet is changed; and
selecting a size of the first conductive sheet which satisfies a standard value required for an electric apparatus on which the wiring member is mounted, on a basis of the measuring noise characteristics.

16. A method of manufacturing a wiring member which is used to manufacture the wiring member using the first conductive sheet having a size designed in the method of designing a wiring member according to claim 15.

* * * * *